(12) United States Patent
Yang et al.

(10) Patent No.: US 7,026,859 B2
(45) Date of Patent: Apr. 11, 2006

(54) CONTROL CIRCUIT FOR DELAY LOCKED LOOP

(75) Inventors: Sun Suk Yang, Anyang-Shi (KR); Byoung Jin Choi, Icheon-Shi (KR)

(73) Assignee: Hynix Semiconductor Inc., Kyungki-Do (KR)

(*) Notice: Subject to any disclaimer, the term of this patent is extended or adjusted under 35 U.S.C. 154(b) by 5 days.

(21) Appl. No.: 10/878,450

(22) Filed: Jun. 28, 2004

(65) Prior Publication Data

US 2005/0231248 A1 Oct. 20, 2005

(30) Foreign Application Priority Data

Apr. 20, 2004 (KR) .................. 10-2004-0027111

(51) Int. Cl.
*H03K 17/687* (2006.01)
(52) U.S. Cl. .................. 327/427; 327/437; 327/576
(58) Field of Classification Search ................ 327/427, 327/437, 450, 576, 603, 142, 150, 159, 355
See application file for complete search history.

(56) References Cited

U.S. PATENT DOCUMENTS

| 5,304,867 | A | * | 4/1994 | Morris | 326/71 |
| 5,982,218 | A | * | 11/1999 | Sugawara | 327/333 |
| 5,986,443 | A | * | 11/1999 | Jeong | 323/312 |
| 6,346,823 | B1 | * | 2/2002 | Kim | 326/29 |

* cited by examiner

Primary Examiner—Timothy P. Callahan
Assistant Examiner—Hai L. Nguyen
(74) Attorney, Agent, or Firm—Marshall, Gerstein & Borun LLP

(57) ABSTRACT

Provided is directed to a delay locked loop control circuit capable of reducing a test time and preventing a yield from being reduced, by preventing a failure due to a charge sharing and a failure in a specific frequency and voltage due to a noise of a feedback clock, by means of including: a level setting unit for setting an initial level of a locked state signal, which is decided whether or not phases of a reference clock and a feedback clock are aligned; a signal generation unit for generating a third control signal according to a first control signal comparing phases of the reference clock and the feedback clock, and a second control signal checking out phases of the reference clock and the feedback clock in every predetermined time; a level maintaining unit for maintaining a level of the locked state signal according to the locked state signal and a fourth control signal comparing a signal delaying the feedback clock for a predetermined time with the reference clock; a detection unit for varying a level of the locked state signal by detecting whether or not phases of a reference clock and a feedback clock are aligned according to the first to third control signals; and a control unit for controlling a variation of the locked state signal by means of the detection unit according to the fourth control signal.

5 Claims, 7 Drawing Sheets

CONTROL CIRCUIT FOR DELAY LOCKED LOOP

This application relies for priority upon Korean Patent Application No. 2004-0027111 filed on Apr. 20, 2004, the contents of which are herein incorporated by reference in their entirety.

BACKGROUND

1. Field of the Invention

The present invention relates to a delay locked loop (hereinafter denoted with DLL), and more particularly to, a mode generator as a DLL control circuit.

2. Discussion of Related Art

Synchronous semiconductor devices operating in sync with an external clock generate an internal clock by using a clock buffer and a clock driver, so that the internal clock is generally delayed for a predetermined time, comparing with the external clock. As a result, an operation performance of a semiconductor device is degraded. That is, it causes a problem that a data access time tAC of the semiconductor device increases as long as a predetermined delay time by a clock buffer in a chip. Accordingly, it is necessary to comprise an internal clock generation circuit in a chip synchronizing with an external clock and a DLL is used as the internal clock generation circuit.

FIG. 1 is a block diagram illustrating a configuration of a general DLL.

A clock buffer 101 outputs an internal clock clkin and a reference clock ref_clk by inputting an external clock signal ext_clk. A DLL controller 102 controls an operation of the DLL by inputting a plurality of control signals control. A clock generator 103 generates a signal for controlling the DLL according to an adjustment of the DLL controller 102 and especially, generates a control signal pden toggling once for every seven clock. A phase detector 104 compares a feedback clock fb_clk outputted through a reference clock ref_clk outputted from the clock buffer 101, a delay line 100 and a replica delay model 112, and then outputs a control signal lag1 in response to the comparison result. A mode generator 105 decides whether or not phases of the reference click ref_clk and the feedback clock fb_clk are aligned according to the control signal pden outputted from the clock generator 103 and the control signal lag1 outputted from the phase detector 104, and then outputs a locked state signal lock_state. A phase sampler 106 inputs the control signal lag1 outputted from the phase detector 104 and then decides a clock rising state thereof for every seven clock. A delay line controller 107 controls first and second delay controllers 108, 109 according to the locked state signal lock_state outputted from the mode generator 105 and an output signal of the phase sampler 106. The first and second delay controllers 108, 109 respectively control a first delay line 110 and a second delay line 111 comprising the delay line 100 and thus adjunt a delay time thereto. The first delay line 110 inputs an internal clock clkin from the clock buffer 101, and delays the internal clock clkin for a predetermined time according to an output signal of the first delay controller 108. The second delay line 111 finely delays a first delayed signal through the first delay line 110. A replica delay model 112 inputs the feedback clock fb_clk to the phase detector 104 by modeling a path up to outputting data in response to the DLL clock in the DRAM. An output driver 113 is comprised of a rising clock driver and a falling clock driver, and thus outputs a clock signal outputted through the DLL.

FIG. 2 is a circuit diagram illustrating a mode generator of the conventional DLL control circuit and FIG. 3 is a waveform diagram illustrating a mode generator during a normal operation. With reference to the FIGS. 2 and 3, it will be described about a method of driving the conventional mode generator as follows.

When a reset signal reset is applied to high level, a first inverter I21 inverts it to low level. A first PMOS transistor P21 is turned on according to a low level output signal of the first inverter I21. Accordingly, a potential of a first node Q21 maintains high level, and the potential of the first node Q21 is inverted by a latch 21, fourth and fifth inverters I24, I25, and then the potential of the first node Q21 is outputted as a locked state signal lock_state in an initial state. After the reset signal reset is applied to low level and then the first PMOS transistor P21 is turned off, a third NMOS transistor N23 is driven according to the first control signal lag1. Here, the level of the first control signal lag1 is decided in response to the result comparing the reference clock ref_clk with the feedback clock fb_clk by means of the phase detector. If the feedback clock fb_clk is low level when the reference clock ref_clk is rising, the first control signal lag1 maintains high level. On the other hand, if the feedback clock fb_clk is high level when the reference clock ref_clk is rising, the first control signal lag1 maintains low level. Furthermore, a fourth NMOS transistor N24 is driven by the second control signal pden toggling once for every seven clock by being outputted from the clock generator. The second control signal pden is inverted through a seventh inverter I27. When the second control signal pden is transited from high level to low level, the seventh inverter I27 inverts the second control signal pden to high level. When the second control signal pden is transited from high level to low level, the signal generator 22 is driven. As a result, the signal generator 22 outputs a third control signal lag1_preb driving the second NMOS transistor N22 by using the first control signal lag1. When the first control signal lag1, the second control signal pden, and the third control signal lag1_preb are all high level, it means that each rising of the reference clock ref_clk and the feedback clock fb_clk is identical each other. During this, the second, third, and fourth NMOS transistors N22, N23, N24 are all turned on, and thus a potential of the first node Q21 becomes low level. The low level potential of the first node Q21 is outputted as a high level locked state signal lock_state through the latch 21, and the fourth and fifth inverters I24, I25. On the other side, when the locked state signal lock_state is low level, the feedback clock fb_clk is continually delayed until the reference clock ref_clk and the feedback clock fb_clk are identical each other and then is performed for shift right.

However, the conventional mode generator may cause a failure due to a charge sharing as shown in FIG. 4, when a layout or a size of a transistor is not correctly set. Referring to FIG. 4, while the feedback clock fb_clk is continually performing shift right, when the reference clock ref_clk and the feedback clock fb_clk have opposite phases each other, the first control signal lag1 becomes low level. Also, when the second control signal pden is transited to low level, the third control signal lag1_perb becomes high level and then the second NMOS transistor N22 is turned on. As the second NMOS transistor N22 is turned on and the third NMOS transistor N24 is turned off, the charge sharing is occurred between the first node Q21 and a second node Q22. Accordingly, when a potential of the first node Q21 falls down as low as inverted through the second inverter 122, although the phases of the reference clock ref_clk and the feedback clock fb_clk are inverted, it causes a failure that the locked state signal lock_state is outputted to high level (A).

FIG. 5 is a waveform diagram illustrating a failure possible to occur due to a feedback clock fb_clk noise. In this case as well, it can be occurred in the condition that the reference clock ref_clk and the feedback clock fb_clk have opposite phases each other. B in FIG. 5 denotes a waveform possible to occur due to the noise. When the reference clock is rising, the feedback clock fb_clk becomes high level by the noise (B). When the second control signal pden is transited from high level to low level, the third control signal becomes high level. Moreover, when the first control signal lag1 becomes high level due to an error of the feedback clock fb_clk at a timing that the second control signal pden becomes high level after seven clock, the second to fourth NMOS transistors N22 to N24 are all turned on. As a result, it is occurred that the locked state signal lock_state is outputted to high level by considering the DLL as being locked (C).

As aforementioned, the problems can be occurred in a specific frequency or voltage during a DRAM operation, which causes decrease of yield for a device. In order to solve those problems, a failure should be detected by performing a test for a specific frequency possible to occur a failure, and a layout of a circuit should be changed according to the detected failure.

SUMMARY OF THE INVENTION

The present invention is directed to provide a DLL control circuit capable of improving a yield by preventing a failure due to a charge sharing occurred by setting a layout or a size of a transistor in a wrong way.

Another object of the present invention is to provide a DLL control circuit capable of improving a yield by preventing a failure due to a noise of a feedback clock.

Here, the DLL control circuit in accordance with the present invention comprises: a level setting unit for setting an initial level of a locked state signal, which is decided whether or not phases of a reference clock and a feedback clock are aligned; a signal generation unit for generating a third control signal according to a first control signal comparing phases of the reference clock and the feedback clock, and a second control signal checking out phases of the reference clock and the feedback clock in every predetermined time; a level maintaining unit for maintaining a level of the locked state signal according to the locked state signal and a fourth control signal comparing a signal delaying the feedback clock for a predetermined time with the reference clock; a detection unit for varying a level of the locked state signal by detecting whether or not phases of a reference clock and a feedback clock are aligned according to the first to third control signals; and a control unit for controlling a variation of the locked state signal by means of the detection unit according to the fourth control signal.

Here, the level setting unit is comprised of: an inverter for inverting the reset signal; and a PMOS transistor for setting an initial level of the locked state signal by means of applying a power supply voltage according to an output of the inverter.

The level maintaining unit includes: a first PMOS transistor for applying the power supply voltage according to the locked state signal; and a second PMOS transistor for maintaining a level of the locked state signal by transferring the power supply voltage applied through the first PMOS transistor according to the fourth control signal.

The detection unit includes a plurality of NMOS transistors driven by the first to third control signals, respectively, and connected in series.

The control unit includes a NMOS transistor driven by the fourth control signal.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Hereinafter, it will be described about embodiments of the present invention with reference to the accompanying drawings in detail.

Figure 1:
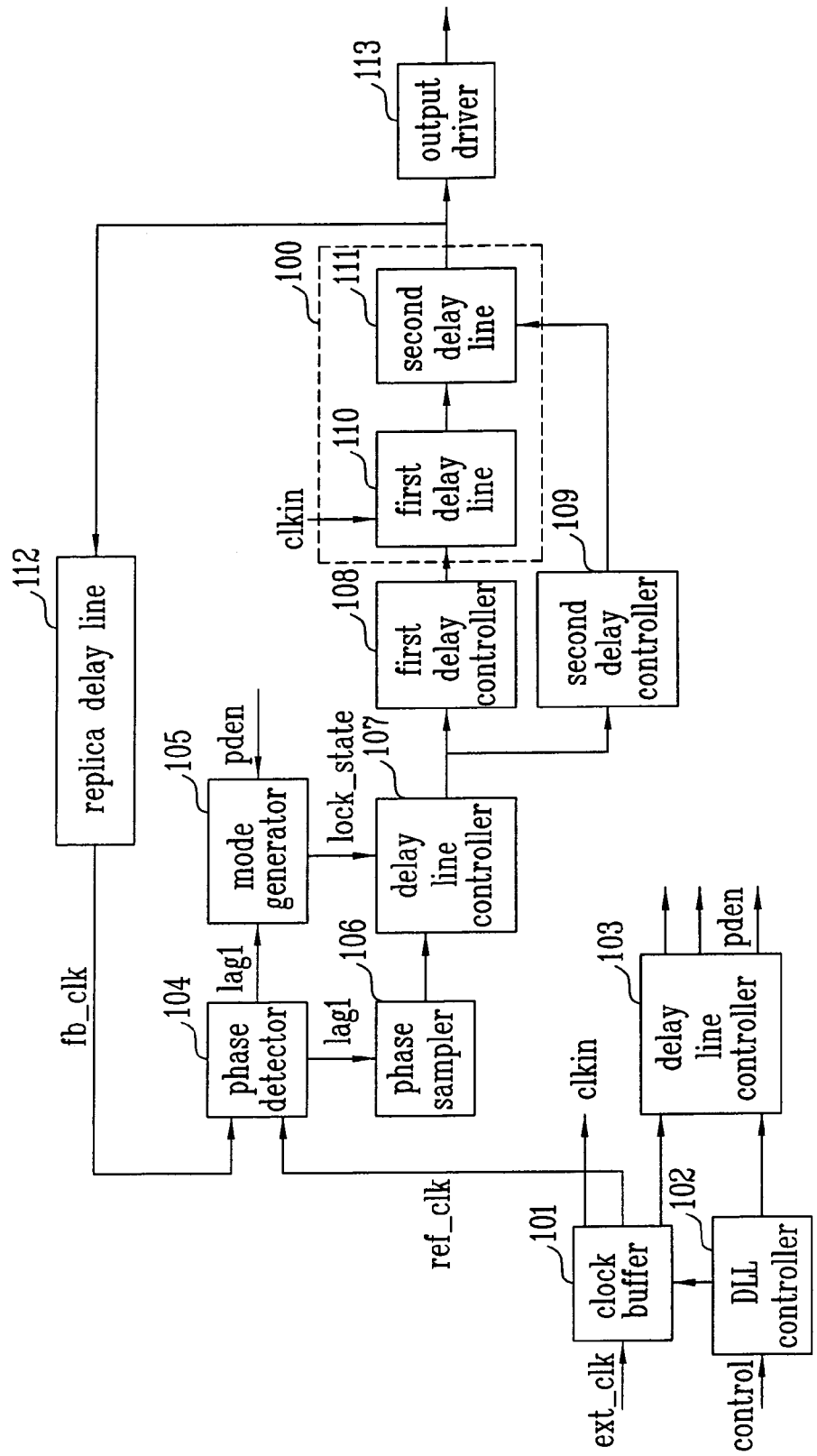
FIG. 1 is a block diagram illustrating a configuration of a general delay locked loop.
Figure 2:
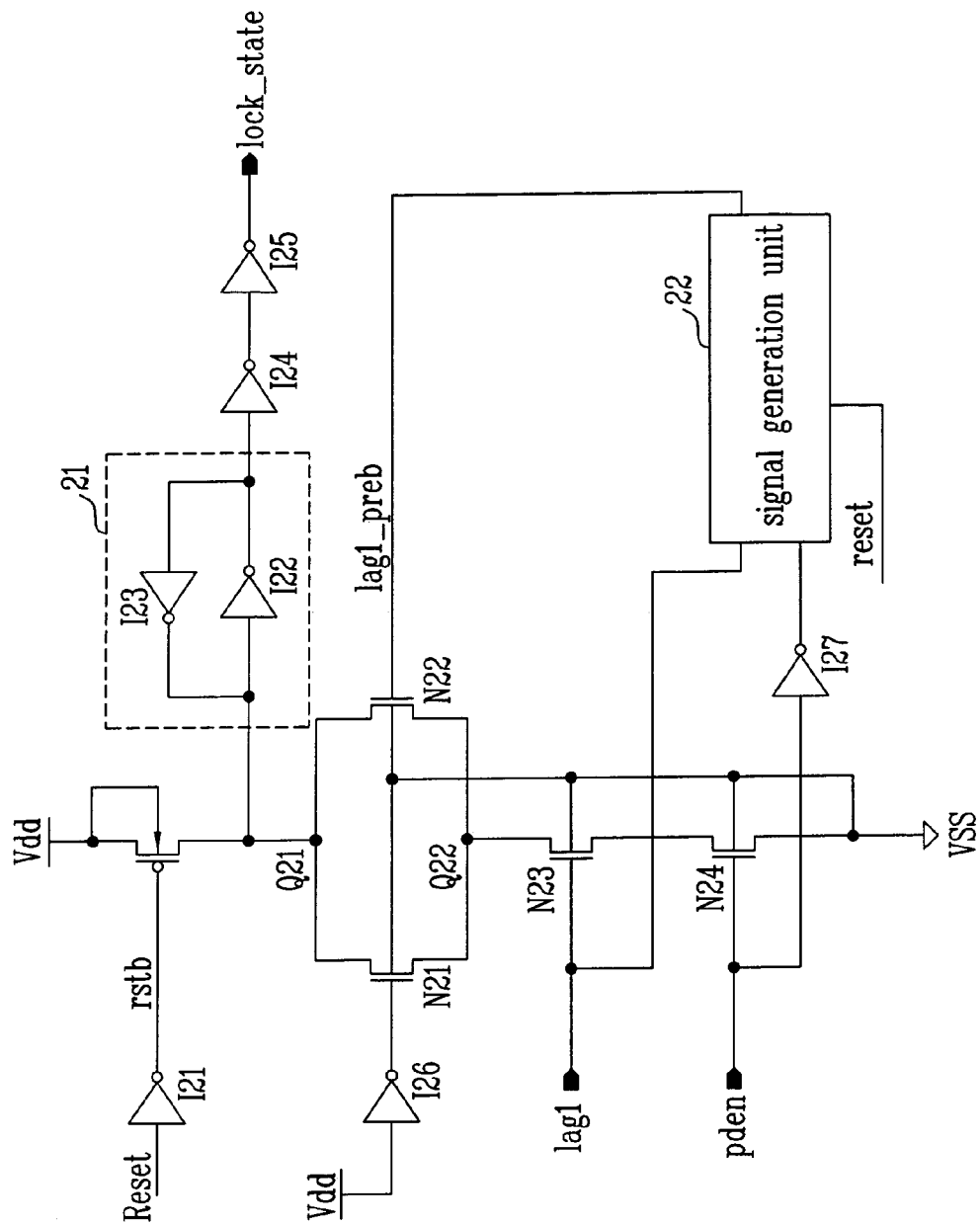
FIG. 2 is a circuit diagram illustrating a mode generator of the conventional delay locked loop.
Figure 3:
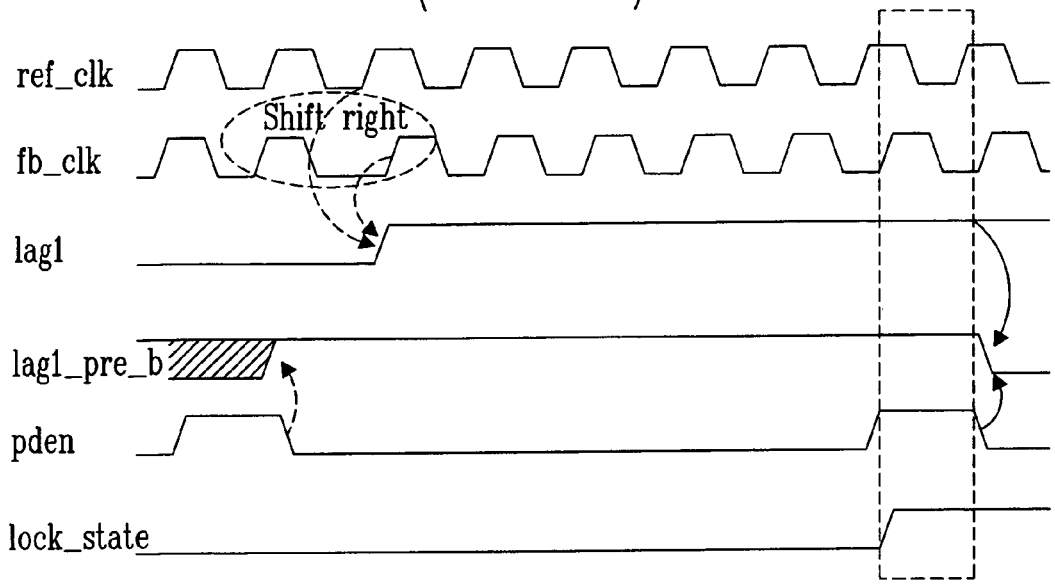
FIG. 3 is a waveform diagram illustrating the conventional mode generator during a normal operation.
Figure 4:
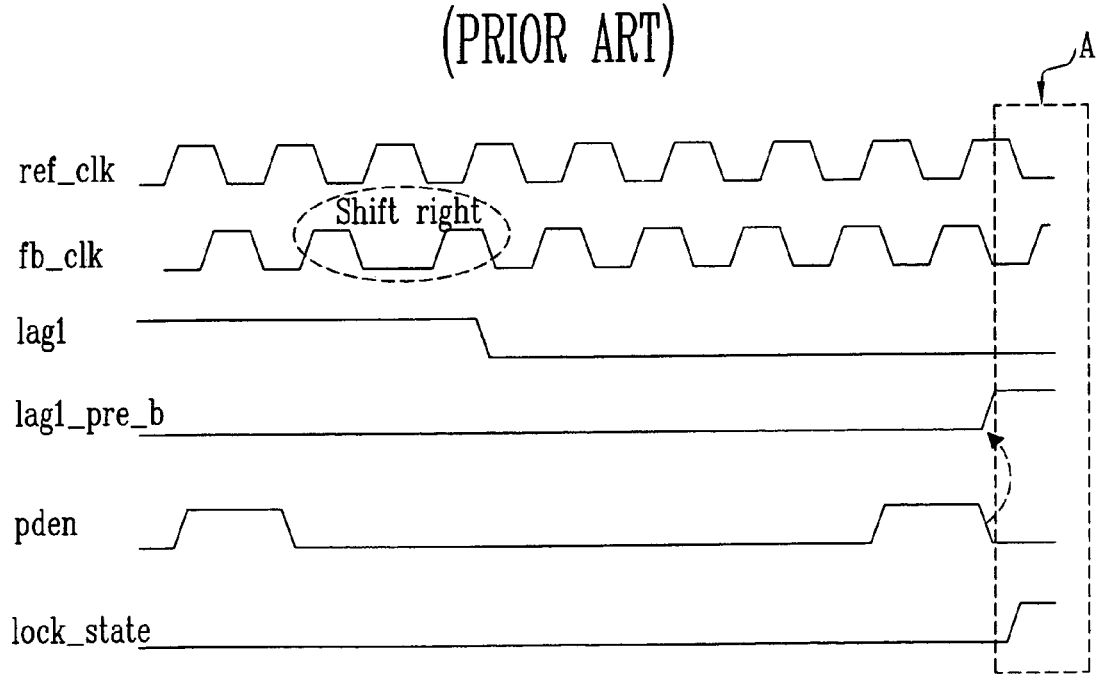
FIGS. 4 and 5 are waveform diagrams illustrating the conventional mode generator during a defective operation.
Figure 5:
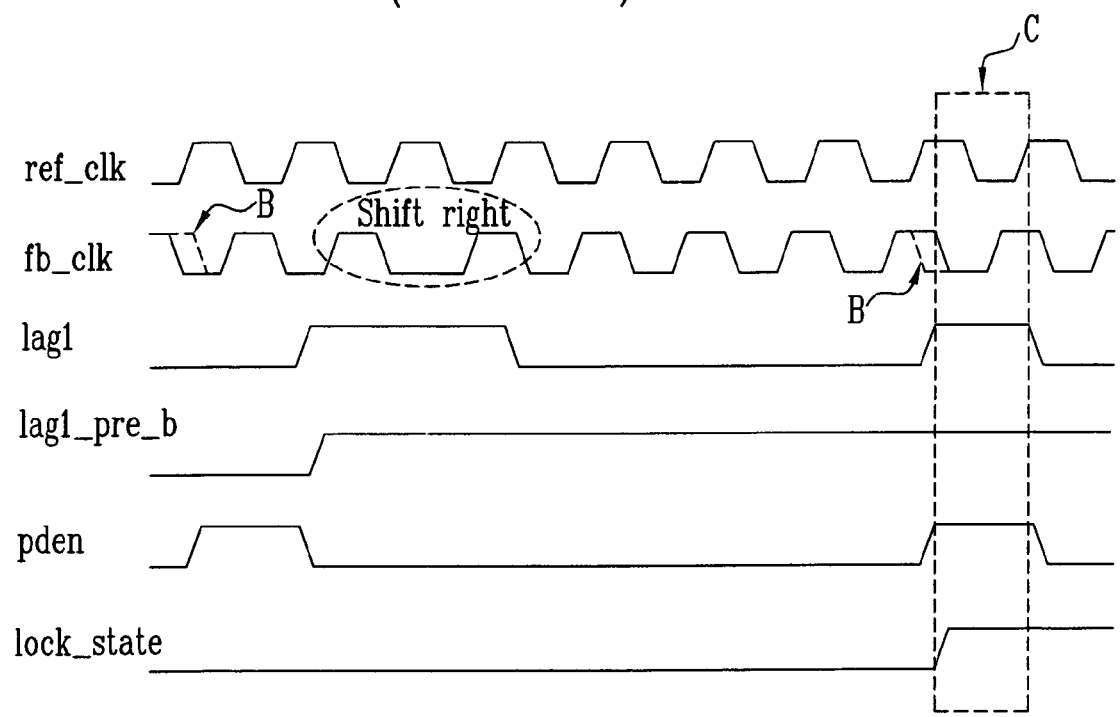
Figure 6:
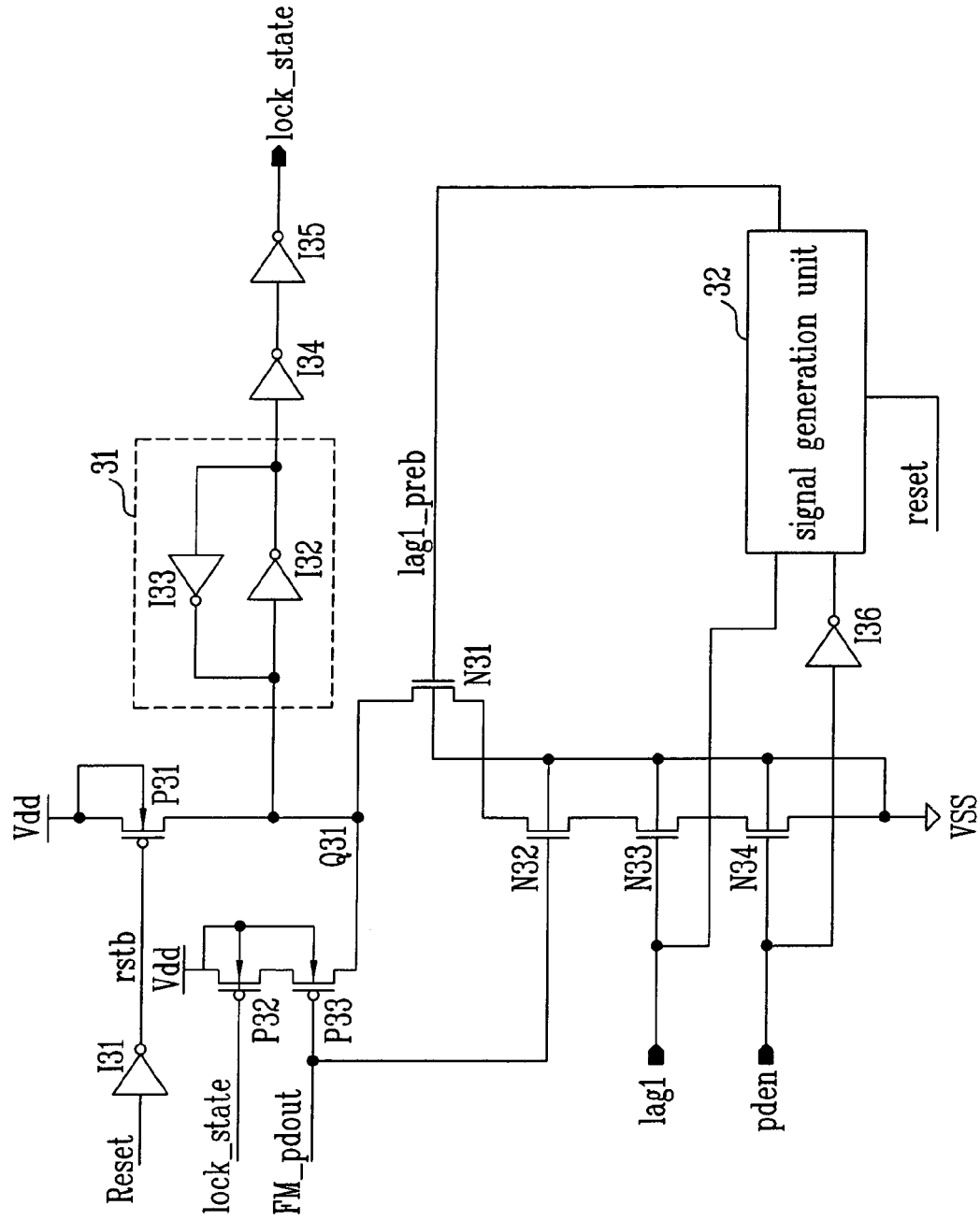
FIG. 6 is a circuit diagram illustrating a mode generator in accordance with the present invention.

FIG. 6 is a circuit diagram illustrating a mode generator as a DLL control circuit in accordance with the present invention.

Referring to FIG. 6, a first PMOS transistor P31 driven by a signal rstb inverting a reset signal reset by way of a first inverter I31 is connected between a power supply terminal Vdd and a first node Q31. Further, second and third PMOS transistors P32, P33 are connected in series between a power supply terminal Vdd and the first node Q31, in which the second PMOS transistor P32 is driven by a locked state signal lock_state, and the third PMOS transistor P33 is driven by a fourth control signal FM_pdout. Here, the fourth control signal FM_pdout, a signal outputted from a phase detector, compares a signal delaying a feedback clock fb_clk for a predetermined time with a reference clock ref_clk and then has the same waveform to a first control signal lag1. Accordingly, if a delay feedback clock fb_clk_d is low level when the reference clock ref_clk is rising, the fourth control signal FM_pdout becomes high level. If the delay feedback clock fb_clk_d is high level: when the reference clock ref_clk is rising, the fourth control signal FM_pdout becomes low level. On the other side, first to fourth NMOS transistors N31 to N34 are connected in series between the first node Q31 and a ground terminal Vss, in which the first NMOS transistor N31 is driven by a third control signal lag1_preb, the second NMOS transistor N32 is driven by the fourth control signal FM_pdout, the third NMOS transistor N33 is driven by the first control signal lag1, and the fourth NMOS transistor N34 is driven by a second control signal pden toggling once for every seven clock. Here, a level of the first control signal lag1 is decided according to the result of comparing the reference clock ref_clk and the feedback clock fb_clk. If the feedback clock fb_clk is low level when the reference clock ref_clk is rising, the first control signal lag1 maintains high level. If the feedback clock fb_clk is high level when the reference clock ref_clk is rising, the first control signal lag1 maintains low level. The signal generation unit 32 is initiated by the reset signal reset, and outputs the third control signal lag1_preb according to the second control signal pden by using the first control signal lag1. On the other hand, the signal generation unit 32 is driven when the second control signal pden is transited from high level to low level. After a potential of the first node Q31 is latched to a latch 31 comprised of second and third inverters I32, I33, it is outputted as a locked state signal lock_state through fourth and fifth inverters I34, I35.

It will now be explained of a driving method of a mode generator as the DLL control circuit in accordance with the present invention configured as aforementioned.

When the reset signal reset is applied to high level, it is inverted to low level by the first inverter I31. The first PMOS transistor P31 is turned on according to a low level output signal of the first inverter I31. Therefore, the potential of first node Q31 maintains high level, and the potential of the first node Q31 is inverted to low level through the latch 31, and the fourth and fifth inverters I34, I35. In response to this, it is outputted as the locked state signal lock_state in the initial state. After the reset signal reset is applied to low level, when each rising of the reference clock ref_clk and the feedback clock fb_clk is identical each other, the first control signal lag1, the second control signal pden, the third control signal lag1_preb and the fourth control signal FM_pdout all become high level. During this, as the first to fourth NMOS transistors N31 to N34 are all turned on and the PMOS transistor P33 is turned off, the potential of the first node Q31 becomes low level. The low level potential of the first node Q31 is outputted as a high level locked state signal lock_state through the latch 31, and the fourth and fifth inverters I34, I35. The second PMOS transistor P32 is turned off according to the high level locked state signal lock_state. On the other hand, when the locked state signal lock_state is low level, the feedback clock fb_clk is continually delayed until the reference clock ref_clk and the feedback clock fb_clk is identical each other, and then performs shift right.

Figure 7:
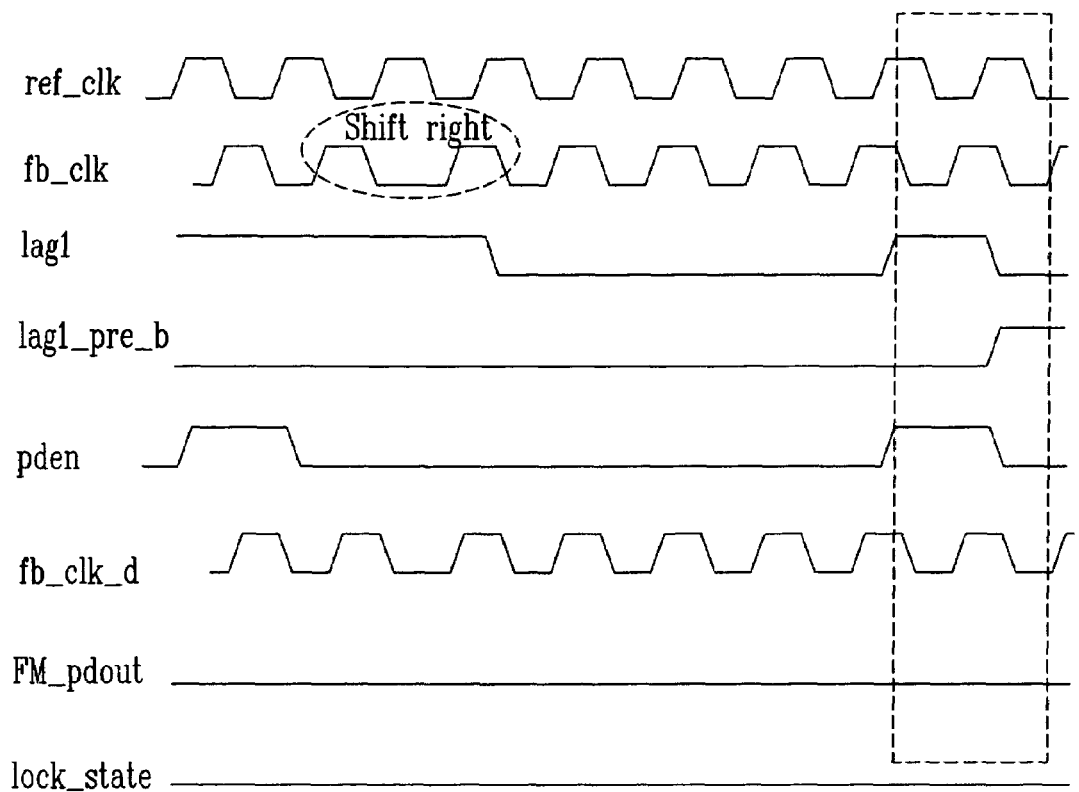
FIG. 7 is a waveform diagram illustrating an operation of a mode generator in accordance with the present invention.
Figure 8:
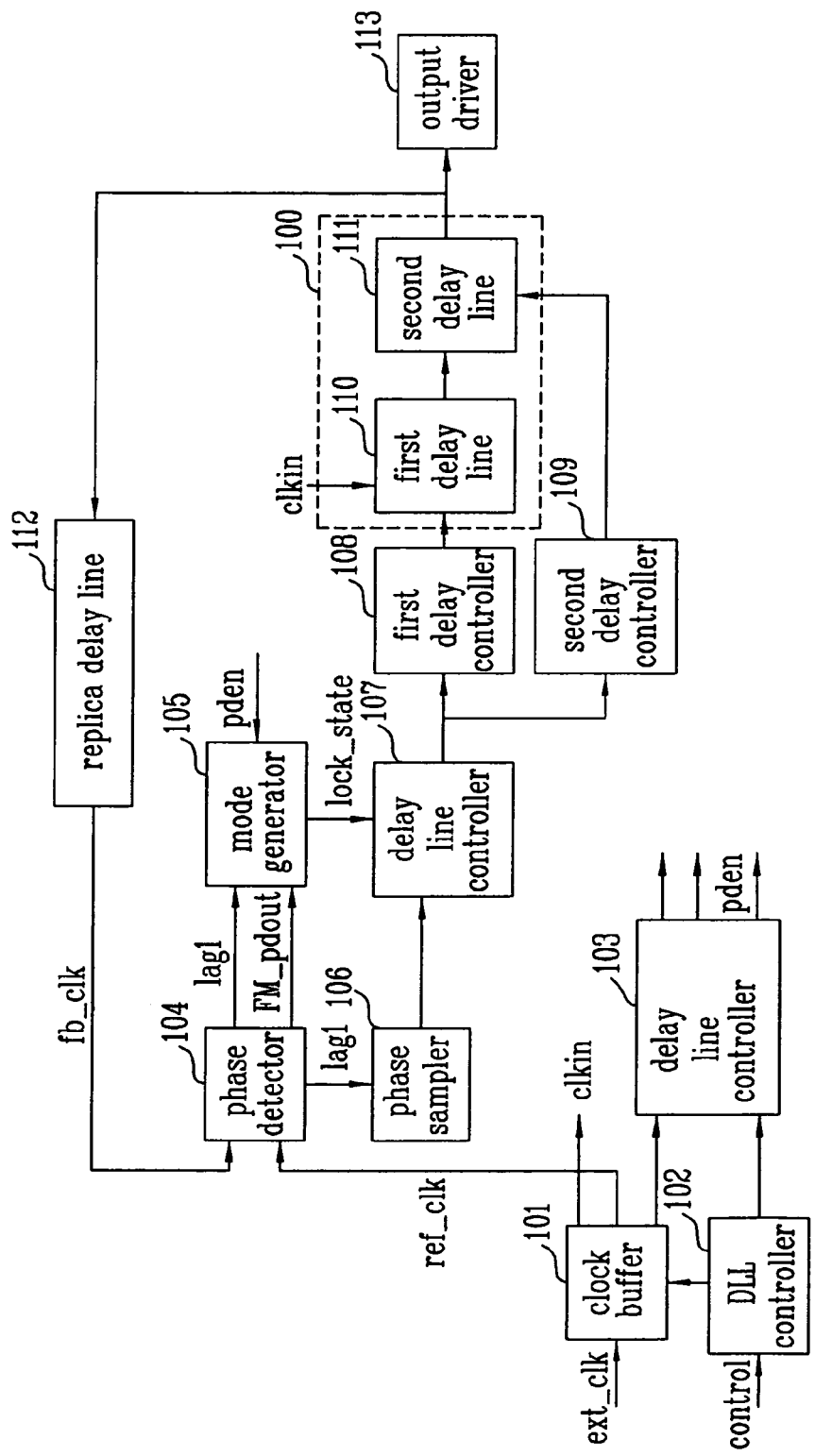
FIG. 8 is a block diagram illustrating a configuration of an exemplary delay locked loop.

However, while the feedback clock fb_clk are performing shifter right, the failure due to a charge sharing, mentioned as a problem of the conventional art, is caused in condition that when the reference clock ref_clk and the feedback clock fb_clk have opposite phases, the first control signal lag1 become low level, and when the second control signal pden is transited to low level, the third control signal becomes high level. However, as shown in FIG. 7, when the charge sharing is occurred, the mode generator according to the present invention maintains the potential of the first node Q31 to high level as the fourth control signal FM_pdout maintains low level to turn off the second NMOS transistor N32 and to turn on the third PMOS transistor P33. It results from that, when the reference clock ref_clk is rising, the delay feedback clock fb_clk_d maintains high level, and thus the fourth control signal FM_pdout maintains low level thereto. Therefore, it can prevent the failure due to the charge sharing by maintaining the locked state signal lock_state to low level.

Furthermore, a failure due to a noise of the feedback clock fb_clk, possible to occur when the reference clock ref_clk and the feedback clock fb_clk have opposite phases, can be prevented as turning off the second NMOS transistor N32 by maintaining the fourth control signal to low level.

As aforementioned, the present invention can prevent the failure due to a charge sharing and the failure in a specific frequency and voltage due to a noise of the feedback clock by comprising in a mode generator: a PMOS transistor driven according to the locked state signal lock_state, as an output signal of the mode generator; and a PMOS transistor and a NMOS transistor driven according to the fourth control signal FM_dout having the same waveform to the first control signal lag1 by comparing a signal fb_clk_d delaying the feedback clock fb_clk for a predetermined time and the reference clock ref_clk. Accordingly, it can reduce a test time in a specific frequency possible to occur a failure during a DRAM operation, and also prevent a yield from being reduced.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:
1. A delay locked loop control circuit, comprising:
a latch connected to a first node for latching a locked state signal;
a level setting unit for setting an initial level of the locked state signal, which is decided whether or not phases of a reference clock and a feedback clock are aligned;
a signal generation unit for generating a third control signal according to a first control signal, the first control signal is a phase difference indicating the result of phases comparison of the reference clock and the feedback clock, and a second control signal, the second control signal is for checking out phases of the reference clock and the feedback clock in every predetermined time;

a level maintaining unit for maintaining a level of the locked state signal according to the locked state signal and a fourth control signal outputted from a phase detector, the fourth control signal is a phase difference indicating the result of phases comparison of a signal delaying the feedback clock for a predetermined time with the reference clock;

a detection unit for varying a level of the locked state signal by detecting whether or not phases of the reference clock and the feedback clock are aligned according to the first to third control signals; and a control unit for controlling a variation of the locked state signal by means of the detection unit according to the fourth control signal.

2. The delay locked loop control circuit of claim 1, wherein the level setting unit includes:

an inverter for inverting a reset signal; and a PMOS transistor for setting the initial level of the locked state signal by applying a power supply voltage according to an output signal of the inverter.

3. The delay locked loop control circuit of claim 1, wherein the level maintaining unit includes:

a first PMOS transistor connected to a power supply terminal for applying the power supply voltage according to the locked state signal; and a second PMOS transistor connected between the first PMOS transistor and the first node, and operated according to the fourth control signal outputted from the phase detector.

4. The delay locked loop control circuit of claim 1, wherein the detection unit includes a plurality of NMOS transistors driven according to the first to third control signals, respectively, and connected in series.

5. The delay locked loop control circuit of claim 1, wherein the control unit includes a NMOS transistor driven according to the fourth control signal.

* * * * *